United States Patent [19]
Gordon et al.

[11] Patent Number: 6,013,920
[45] Date of Patent: Jan. 11, 2000

[54] WAFER-MAPPING LOAD POST INTERFACE HAVING AN EFFECTOR POSITION SENSING DEVICE

[75] Inventors: Jeffrey M. Gordon; Cyril M. Kindt, both of Sunnyvale; Kenneth A. Hardy; Steven A. Bumgardner, both of San Jose; William E. Wegener, Union City; Eric Meyhofer, Palo Alto, all of Calif.

[73] Assignee: Fortrend Engineering Coirporation, Sunnyvale, Calif.

[21] Appl. No.: 09/199,931

[22] Filed: Nov. 25, 1998

Related U.S. Application Data

[60] Provisional application No. 60/067,313, Nov. 28, 1997.
[51] Int. Cl.[7] .................................................. G01N 21/86
[52] U.S. Cl. .............................. 250/559.36; 250/559.33; 414/937
[58] Field of Search .......................... 250/559.36, 559.33, 250/559.27, 559.4, 548, 221; 414/937, 939; 356/375

[56] References Cited
U.S. PATENT DOCUMENTS 5,783,834   7/1998   Shatas ................................. 250/559.33

*Primary Examiner*—Que T. Le
*Attorney, Agent, or Firm*—Donald E. Schreiber

[57] ABSTRACT

A load port interface (20) receives, opens and closes a wafer carrier (22). A bulkhead (24) carries a changeable mating plate (92) that is pierced by a window (94). Changing the mating plate (92) adapts the load port interface (20) for use with different sizes of carriers(22). A table (32) of the load port interface (20) receives the carrier (22), advances the carrier (22) until it abuts and seals to the bulkhead (24). An end-effector (42), located on an opposite side of the bulkhead (24) from the carrier (22), actuates latch keys (54) to unlatch a door (48) from the carrier (22). The load port interface (20) then moves the unlatched door (48) rectilinearly, first horizontally away from the bulkhead (24) and then vertically downward, to expose semiconductor wafers (48) present within the carrier (22). The end-effector (42) includes sensors (86, 104) for collecting data about wafers (82) within the carrier (22) by detecting edges (118) thereof. This data is analyzed to determine the arrangement of wafers (82) within the carrier (22).

9 Claims, 9 Drawing Sheets

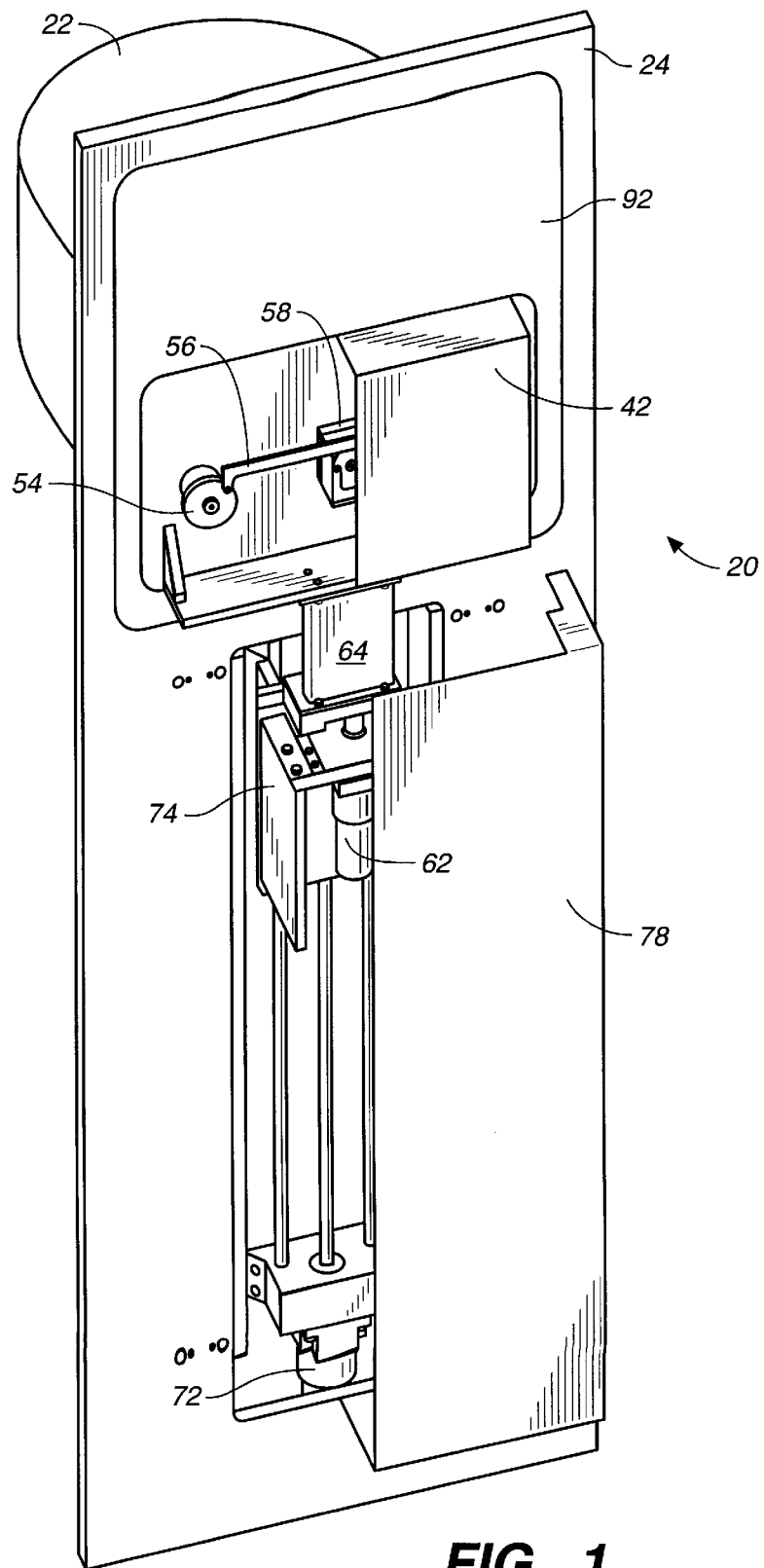
FIG._1

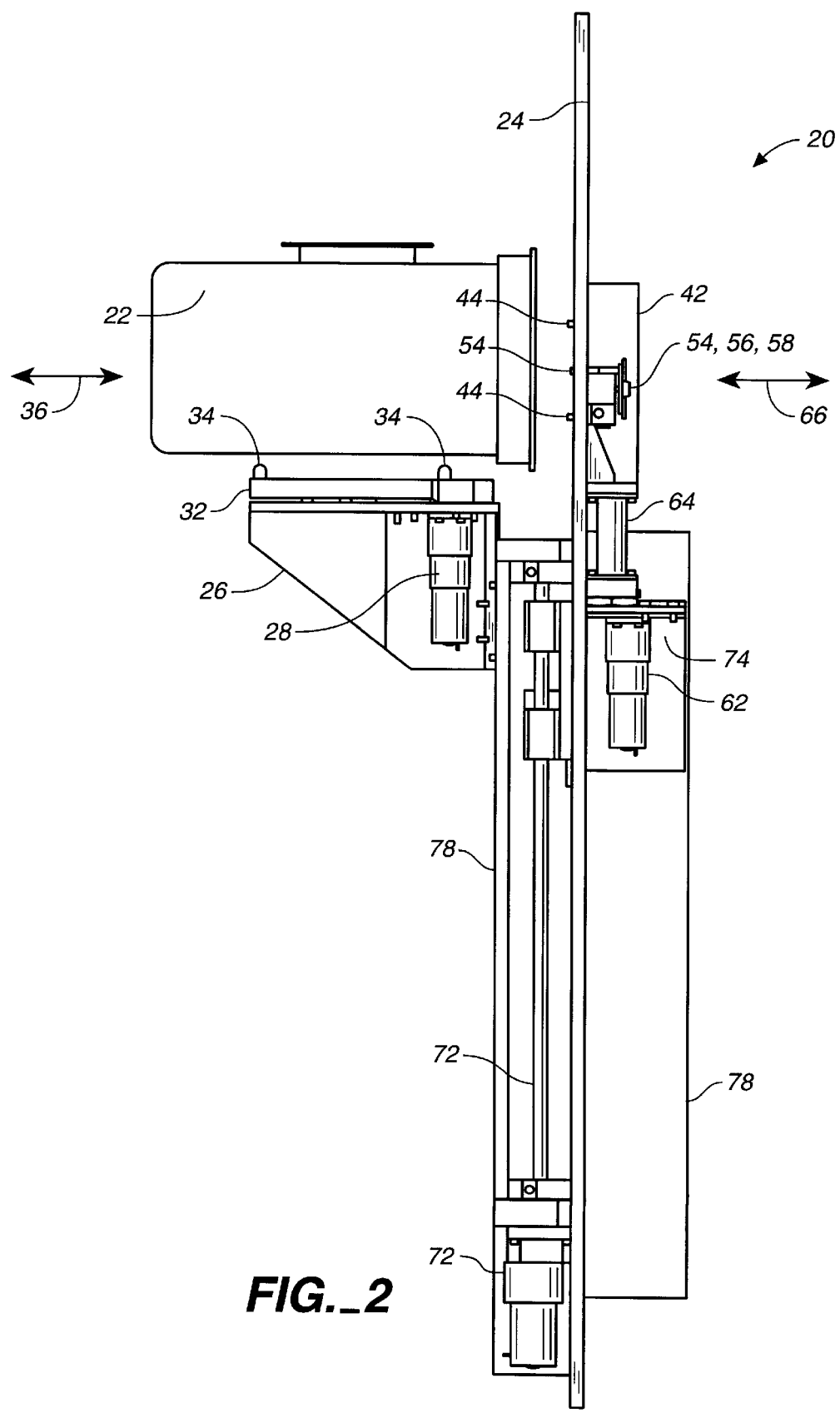
FIG._2

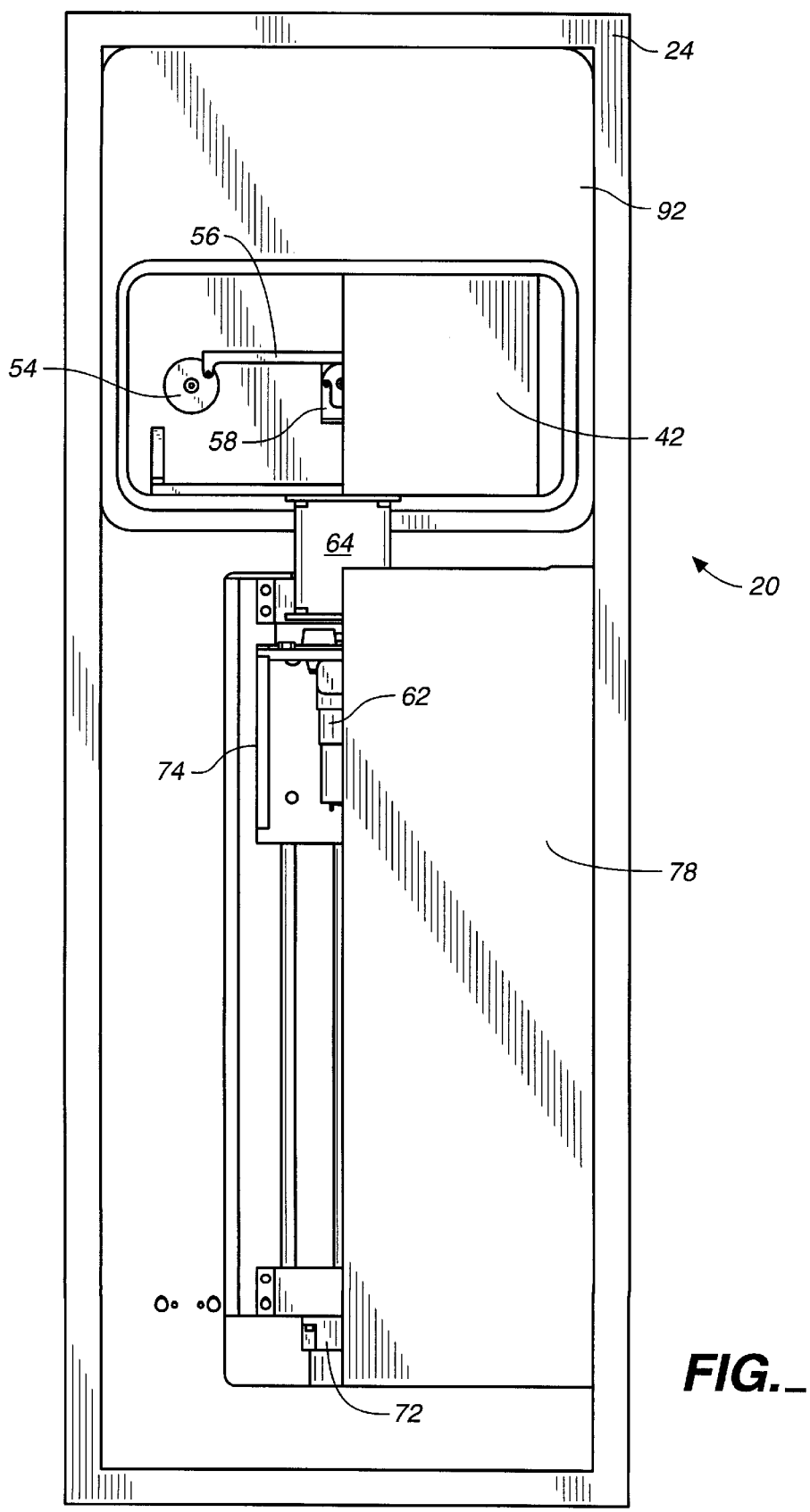
FIG._3

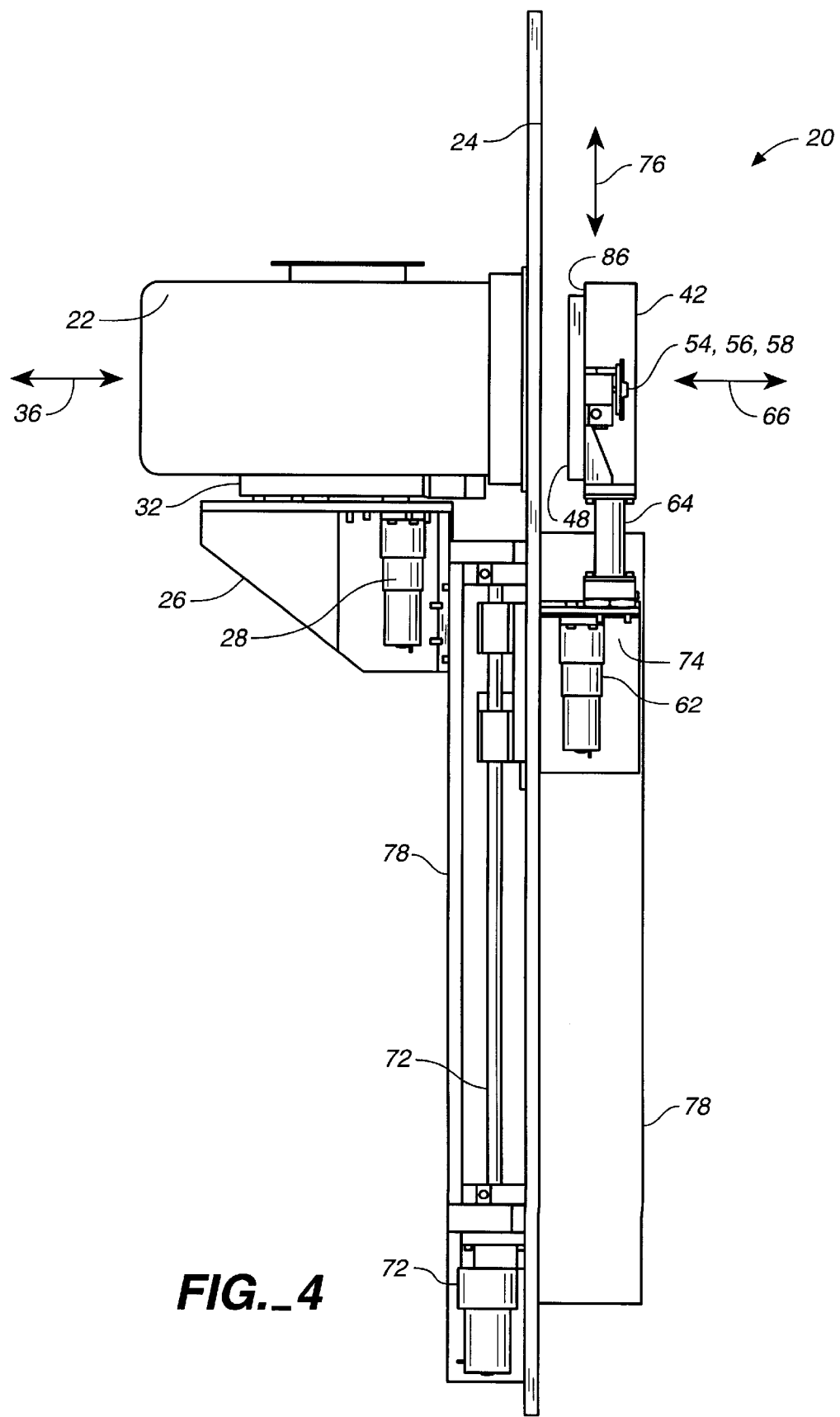
FIG._4

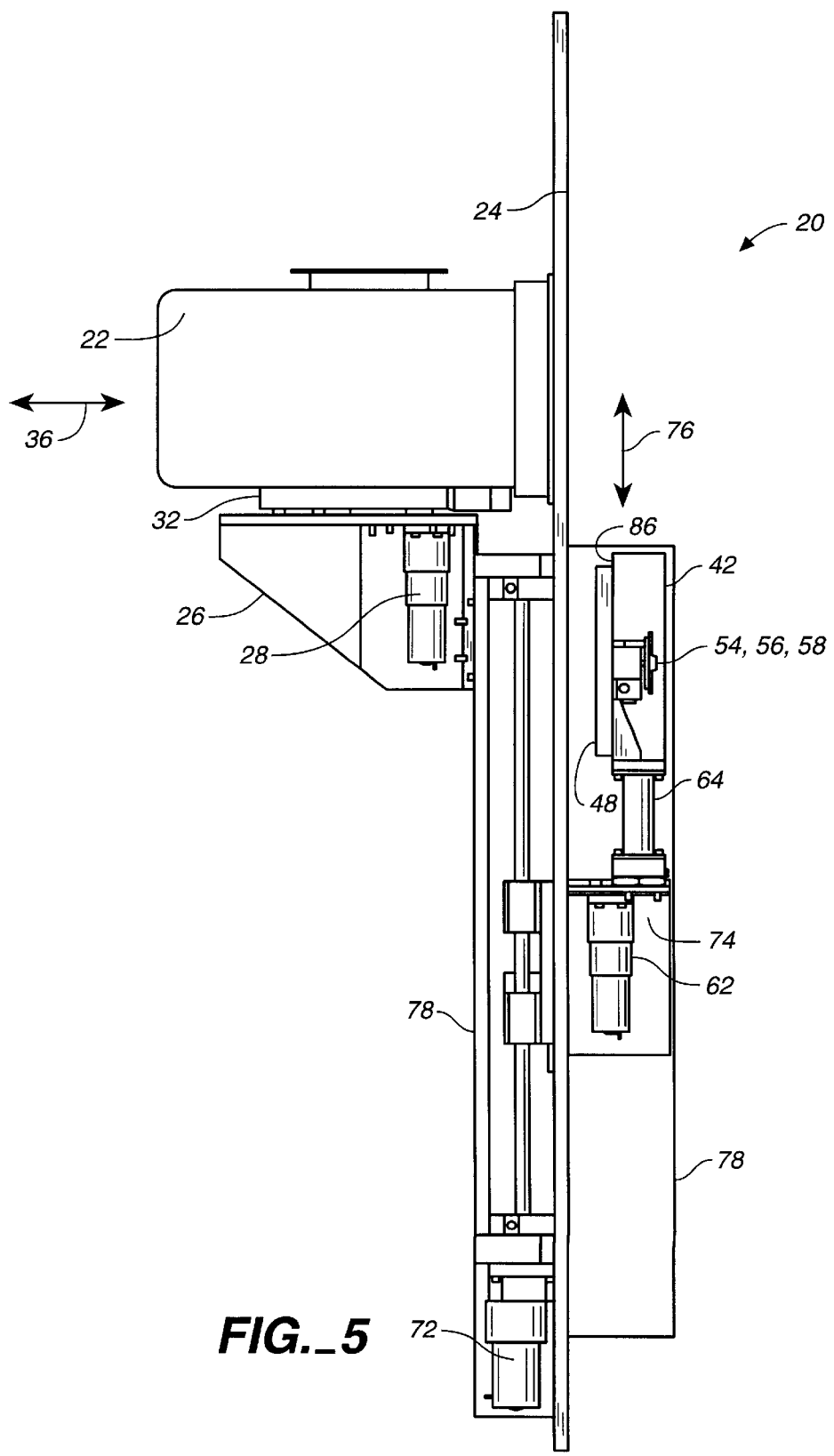
FIG._5

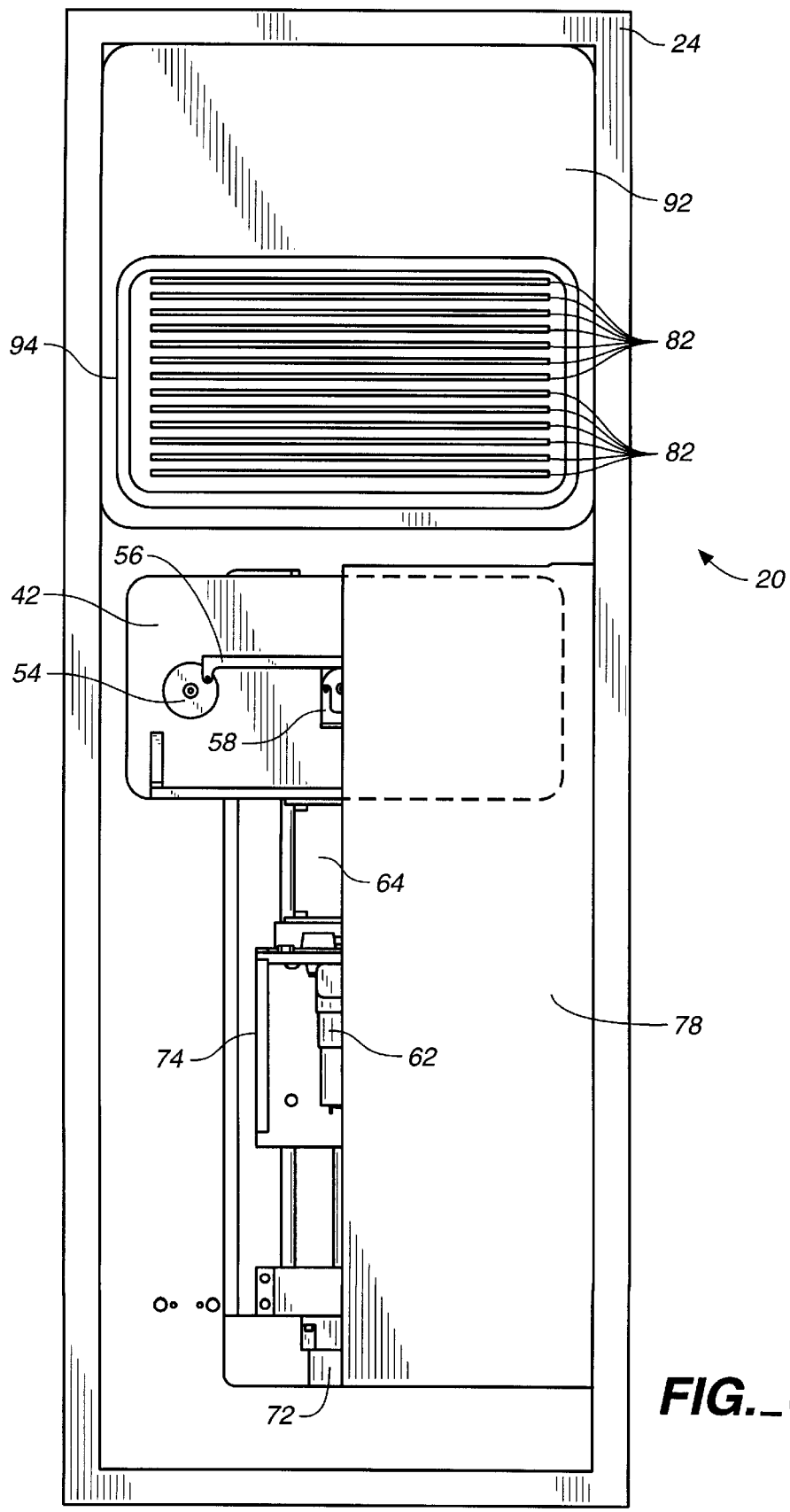
FIG._6

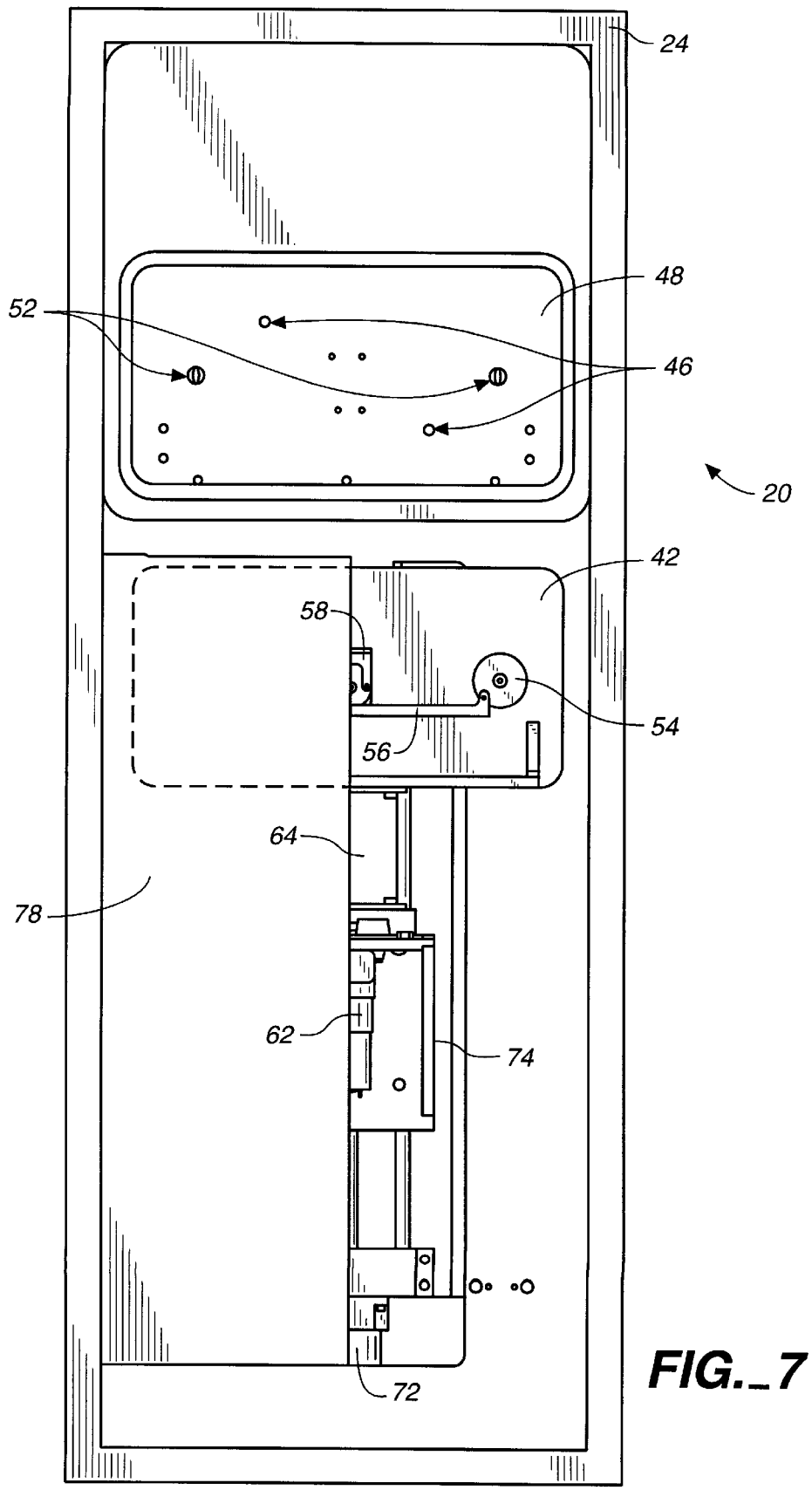
FIG._7

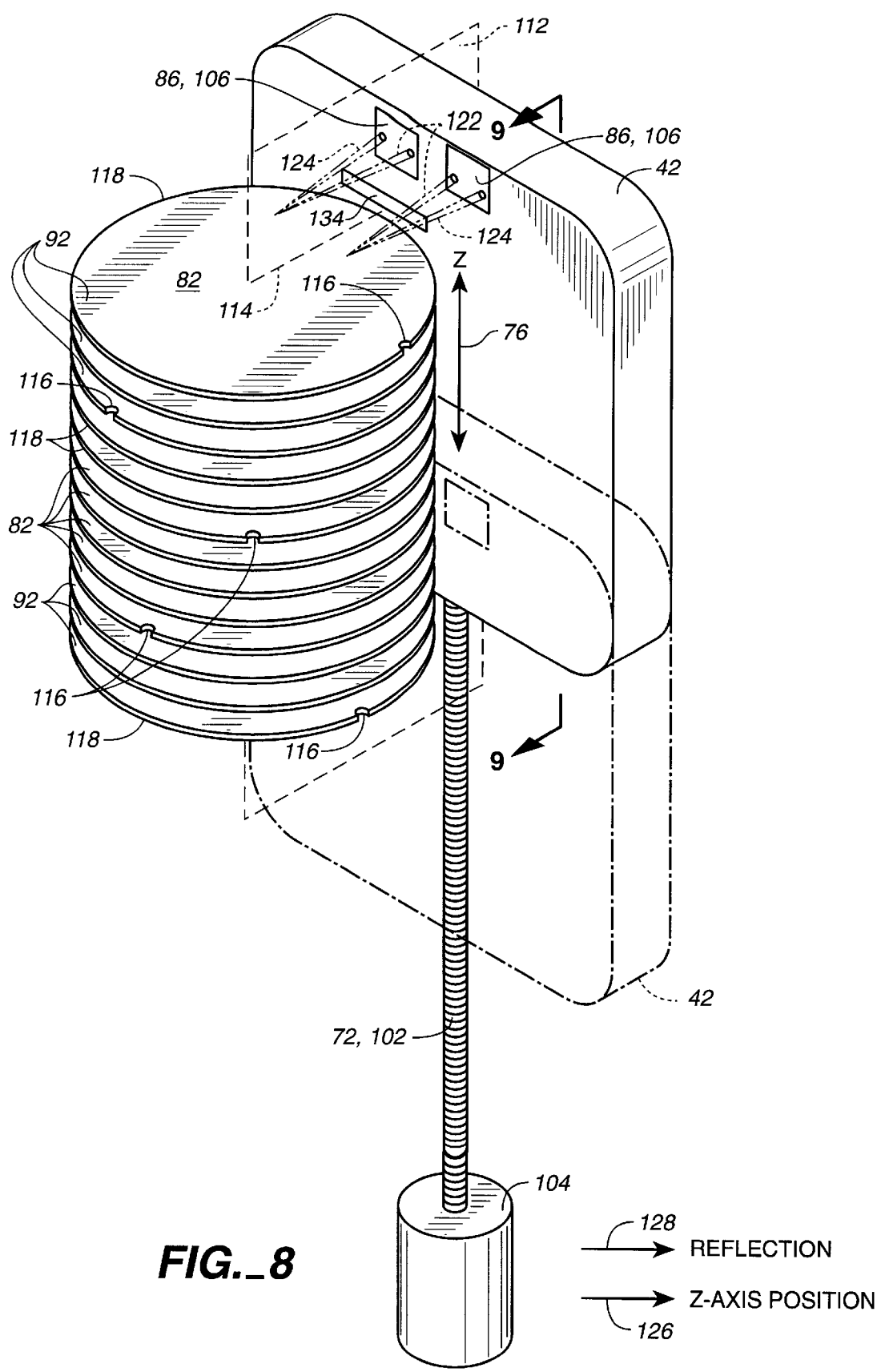
FIG._8
→ 128 REFLECTION
→ Z-AXIS POSITION
126

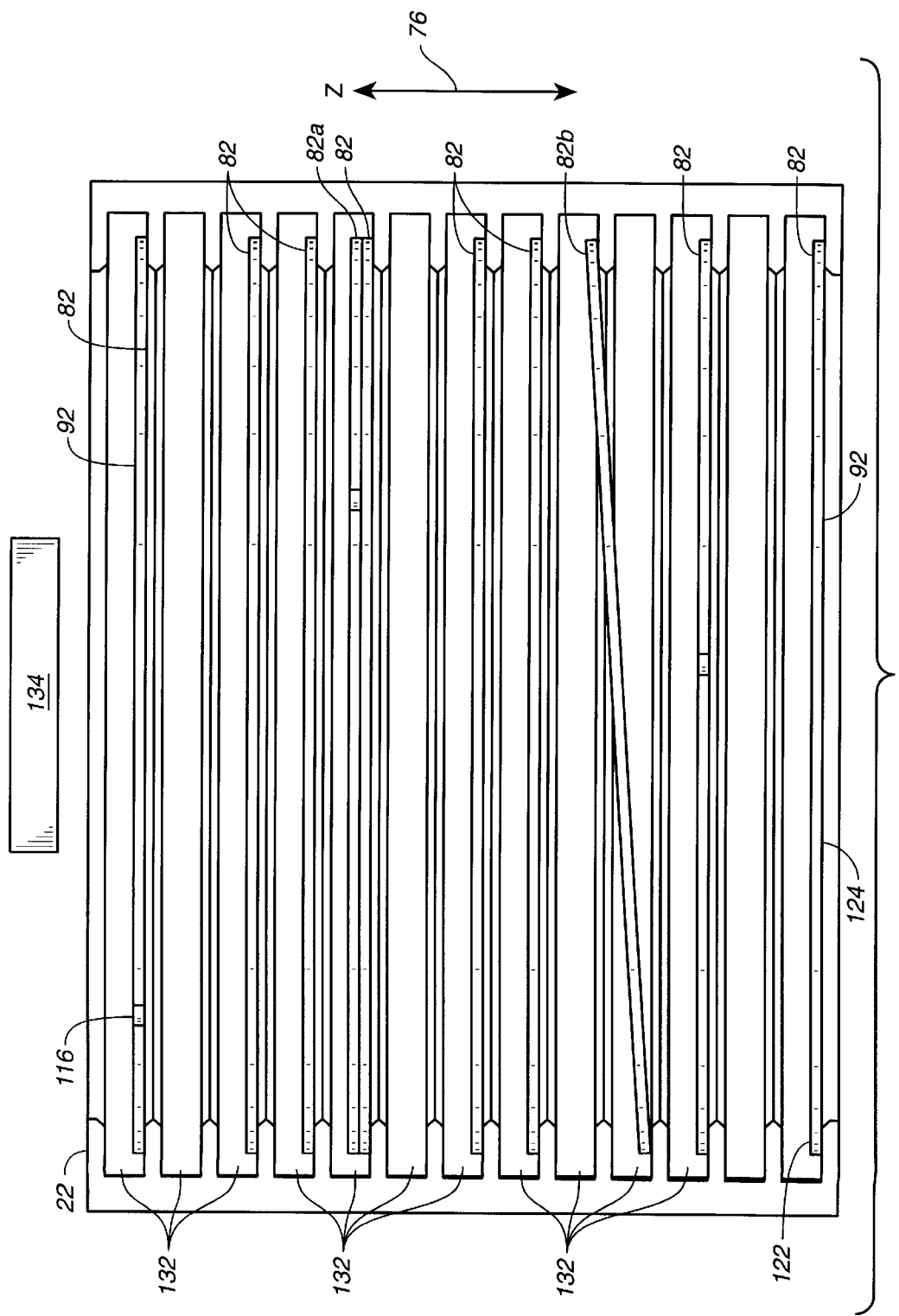
FIG._9

_6,013,920_

WAFER-MAPPING LOAD POST INTERFACE HAVING AN EFFECTOR POSITION SENSING DEVICE

CLAIM OF PROVISIONAL APPLICATION RIGHTS

This application claims the benefit of U.S. Provisional Patent Application No. 60/067,313 filed on Nov. 28, 1997.

BACKGROUND OF THE INVENTION

1. Field of the Invention

The present invention relates generally to materials handling apparatus used in manufacturing, and, more particularly, to devices for automatically accessing disk-shaped objects present in a carrier.

2. Description of the Prior Art

Recently, semiconductor equipment manufacturing companies have adopted a new standard for sealed carriers to be used for transporting 300 mm diameter, disk-shaped, semiconductor wafers between semiconductor processing machines. This new standard carrier, identified by the name Front Opening Unified Pod ("FOUP"), differs from a prior carrier for 8 inch diameter, disk-shaped, semiconductor wafers, identified by the name Standard Mechanical Inter-Face ("SMIF"), in various different ways. For example, exposing 8 inch diameter semiconductor wafers that are enclosed within the prior SMIF pod requires unlatching and removing from a base of the SMIF pod a one-piece removable cover that provides the top and sides of the SMIF pod. Alternatively, gaining access to 300 mm diameter semiconductor wafers enclosed within the newer FOUP requires unlatching and removing a door from one side of the FOUP.

Furthermore, while the prior SMIF pod has only one size, the recently adopted standard actually envisions four different sizes of FOUPS. First, the standard envisions FOUPs that are capable of carrying, in uniformly-spaced slots located within the FOUP, either 13 or 25 semiconductor wafers. These two different classes of FOUPs are respectively identified herein by the phrases shorter FOUP and taller FOUP. Second, the standard also envisions FOUPs identified as unified or non-unified. A non-unified FOUP encloses a separately removable wafer boat that, depending upon the carrying capacity of the FOUP, holds either 13 or 25 semiconductor wafers in its uniformly-spaced slots. Conversely, a unified FOUP omits the separately removable wafer boat. Thus, in general, a unified FOUP allows removing only a single wafer at a time from the FOUP's uniformly-spaced slots, or inserting only a single wafer at a time into one of the FOUP's slots. Conversely, a non-unified FOUP allows simultaneously removing from the FOUP, en masse, as many as 13 or 25 semiconductor wafers that are held within the wafer boat, or simultaneously inserting into the FOUP, en masse, as many as 13 or 25 semiconductor wafers that are held within the wafer boat. Because the non-unified FOUP must enclose the separate, removable wafer boat, the non-unified FOUP has a larger exterior than the smaller non-unified FOUP capable of carrying an identical number of semiconductor wafers. Correspondingly, the recently adopted standard envisions four different sizes for the door on the side of the FOUP that must be removed to gain access to 300 mm diameter semiconductor wafers enclosed within the FOUP.

To permit mechanically clamping a FOUP to semiconductor processing equipment, each FOUP includes both wedge shaped ramps on the exterior of the FOUP, and oval shaped holes in the bottom of the FOUP. Because semiconductor manufacturing requires extreme cleanliness, semiconductor processing equipment must include a load port interface that automatically unlatches and removes the door from the side of the FOUP secured thereto to expose to the wafer processing equipment the semiconductor wafers enclosed therein. After semiconductor wafers have been processed, the semiconductor processing equipment must also automatically reinsert and relatch the door onto the side of the FOUP to seal the wafers within the FOUP. One existing load port interface adapted for opening and closing a FOUP employs a pivoting arm one end of which carries an end-effector adapted to mate with and engage the FOUP's door. After the end-effector engages and unlatches the FOUP's door, the arm rotates away from the FOUP swinging the end-effector carrying the door through an arc thereby exposing the semiconductor wafers within the FOUP. Conversely, the arm of such a load port interface rotates toward the FOUP to swing a door carried by the end-effector into a latching position on the side of the FOUP where the end-effector the subsequently relatches the door onto the FOUP.

While depending upon the type of FOUP, FOUPs may carry either 13 or 25 wafers, they may also carry a fewer number of wafers in the uniformly-spaced slots provided by the unified FOUP, or by the wafer boat included in the non-unified FOUP. Thus, effective utilization of semiconductor processing equipment requires that such equipment determine the number and location of semiconductor wafers within a FOUP after the FOUP has been opened before the equipment begins processing those semiconductor wafers. Moreover, while the specification for and design of the FOUP envisions only carrying a single wafer in each of the uniformly spaced wafer slots, during real-world operation of automatic wafer handling equipment sometimes:

1. two (2) wafers may, in fact, be inserted into a single slot; or
2. a single wafer may be inserted at a skewed angle so diametrically opposite edges of the wafer are respectively located in two (2) immediately adjacent slots.

BRIEF SUMMARY OF THE INVENTION

An object of the present invention is to provide a FOUP load port interface that further improves operation of semiconductor processing equipment attached thereto.

Another object of the present invention is to provide a FOUP load port interface that facilitates collection of data about the number and location of semiconductor wafers within a FOUP to enhance effective utilization of attached semiconductor processing equipment.

Another object of the present invention is to provide a FOUP load port interface that may be readily adapted for use with different sizes of FOUPs.

Briefly, one aspect of the present invention is a load port interface adapted for receiving, opening, and closing a FOUP. The load port interface includes a bulkhead that supports various different parts of the load port interface, and that mates with and seals to semiconductor processing equipment. A replaceable FOUP-mating plate included in the bulkhead is pierced by a window that mates with one of the four particular sizes of FOUP. By changing this FOUP-mating plate, a load port interface in accordance with the present invention may be readily adapted to mate with a particular size of FOUP.

A table, included in the load port interface, that is supported on one side of the bulkhead receives the FOUP orienting a side of the FOUP that includes a removable door toward the bulkhead. After the FOUP is present on the table, a motor drives the table horizontally toward the bulkhead thereby abutting the FOUP against and sealing the FOUP to the bulkhead. The load port interface includes an end-effector that abuts against and seals to the opposite side of the bulkhead from the FOUP. After both the FOUP and the end-effector abut against the bulkhead, mechanically actuated latch keys included in the end-effector rotate to unlatch the door from the FOUP.

After the door has been unlatched from the FOUP, the load port interface moves the end-effector carrying the door rectilinearly, first horizontally away from the bulkhead and then vertically downward, thereby exposing to attached semiconductor processing equipment the semiconductor wafers carried within the FOUP. By reversing the sequence of operations described above, the load port interface restores the door to the FOUP thereby sealing semiconductor wafers within the FOUP.

In another aspect of the present invention the end-effector includes a wafer sensor that moves past semiconductor wafers present in the FOUP as the end-effector descends vertically. Thus, as the end-effector descends the load port interface collects data about both the number and location of the wafers within the FOUP, and determines whether the wafers are properly located in the FOUP with only one (1) wafer occupying each slot. Consequently, the load port interface includes position-sensing means that provides coordinate data indicating locations of the effector as said drive-mechanism moves the effector along an axis past edges of semiconductor wafers. The wafer sensor detects edges of the semiconductor wafers as the effector moves along the stack, and in response to the sensing thereof transmits an edge-detection signal.

A wafer-locating means included in the load port interface receives the coordinate data from the position-sensing means and the edge-detection signal from the sensor. The wafer-locating means uses the received coordinate data and edge-detection signal to determines when:

a) a single semiconductor wafer occupies a particular slot in the FOUP;

b) a semiconductor wafer crosses a slot within the FOUP thereby the semiconductor wafer has a segment of the edge thereof disposed in a first slot and a diametrically opposite segment of the edge thereof disposed in a second slot that is immediately adjacent to the first slot; and c) a single slot holds two semiconductor wafers.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 1 is a partially cut-away, perspective view of a load port interface in accordance with the present invention adapted to receive a FOUP that shows an end-effector adapted to mate with and engage the door of the FOUP, and an elevator for raising and lowering the end-effector;

FIG. 2 is a partially cut-away, side elevational view of the load port interface, taken along the line 2—2 in FIG. 1, that depicts the load port interface receiving the FOUP, and the end-effector raised to a height at which it can mate with and engage the door of the FOUP;

FIG. 3 is a partially cut-away, front elevational view of the load port interface, taken along the line 3—3 in FIG. 1, that depicts the end-effector raised to the same height as that depicted in FIG. 2 at which the end-effector can mate with and engage the door of the FOUP;

FIG. 4 is a partially cut-away, side elevational view of the load port interface that, similar to the illustration of FIG. 2, depicts the end-effector raised to a height at which it can mate with and engage the door of the FOUP after the end-effector, in removing the door from the FOUP, has moved horizontally away therefrom;

FIG. 5 is a partially cut-away, side elevational view of the load port interface, similar to the view of FIG. 2, that depicts the end-effector after it has dropped vertically to expose semiconductor wafers carried within the FOUP;

FIG. 6 is a partially cut-away, front elevational view of the load port interface, similar to the view of FIG. 3, that, similar to the illustration of FIG. 5, depicts the end-effector after it has dropped vertically thereby exposing the semiconductor wafers carried within the FOUP;

FIG. 7 is a partially cut-away, front elevational view of the load port interface, similar to the view of FIG. 6, with the end-effector lowered vertically below the door of the FOUP, that depicts the door of the FOUP latched into and sealing the FOUP;

FIG. 8 schematically illustrates lead screw effected movement of the end-effector vertically along a stack of semiconductor wafers to sense the presence of wafers by reflection of a pair of light beams projected from a wafer sensor mounted on the end-effector; and FIG. 9 schematically illustrates a stack of semiconductor wafers carried in the FOUP together with a reflective fiducial included in the load port interface as viewed from the end-effector along a line 9—9 in FIG. 8.

DETAILED DESCRIPTION

FIG. 1 depicts a load port interface in accordance with the present invention that is referred to by the general reference character 20. As best illustrated in FIGS. 1, 2, 4 and 5, the load port interface 20 is adapted to receive, to open, and to close a FOUP 22. The load port interface 20 includes a bulkhead 24 that mates with and seals to semiconductor processing equipment, not illustrated in any of the FIGS. As illustrated in FIGS. 2, 4 and 5, a vertical support brace 26 projects outward horizontally from one side of the load port interface 20. A motorized pod advance drive mechanism 28, secured within the vertical support brace 26, rotates a cam to displace a moveable table 32, that rests upon the vertical support brace 26, horizontally toward or away from the bulkhead 24. The FOUP 22 includes apertures (not depicted in any of the FIGS.) that receive kinematic coupling pins 34, depicted in FIG. 2, when the FOUP 22 rests on the moveable table 32. Thus, as illustrated in FIGS. 2, 4 and 5 by a double-headed arrow 36, during normal operation of the load port interface 20:

1. the FOUP 22 is placed onto the moveable table 32 by an operator;

2. a FOUP locking mechanism engages the base of the FOUP 22 thereby locking it to the moveable table 32; and 3. the pod advance drive mechanism 28 is then energized to move the moveable table 32 carrying the FOUP 22 horizontally so the FOUP 22 abuts with and seals against the bulkhead 24.

On the other side of the bulkhead 24 from the FOUP 22, the load port interface 20 also abuts a FOUP door-engaging end-effector 42 that also seals against the bulkhead 24.

When both the FOUP 22 and the end-effector 42 are abutted against the bulkhead 24, door-registration pins 44 depicted in FIG. 2, that project horizontally outward from the end-effector 42, mate with and engage door-registration pin-apertures 46, depicted in FIG. 7, that are included in a door 48 of the FOUP 22. The door 48 also includes a pair of latch-key apertures 52 which mate with a corresponding pair of latch keys 54, depicted in FIG. 2, that are included in the end-effector 42. A connecting rod 56 couples each of the latch keys 54 to a latch-drive motor 58 located approximately at the center of the end-effector 42. After the latch keys 54 mate with and engaged the latch-key apertures 52 included in the door 48, energizing the latch-drive motor 58 causes the latch keys 54 to rotate thereby unlatching the door 48 from the remainder of the FOUP 22.

A motorized door-removal drive-mechanism 62 included in the load port interface 20 supports the end-effector 42 at an upper end of a pedestal 64. After the latch keys 54 unlatch the door 48 from the remainder of the FOUP 22, energizing the door-removal drive-mechanism 62 rotates a cam that retracts the end-effector 42 carrying the door 48 horizontally away from the bulkhead 24 as indicated by a double-headed arrow 66 in FIGS. 2 and 4. A motorized lead screw door vertical-movement drive-mechanism 72 included in the load port interface 20 supports the door-removal drive-mechanism 62 on a vertical support bracket 74. After the door-removal drive-mechanism 62 fully retracts the end-effector 42 carrying the door 48 away from the bulkhead 24, as indicated by a double-headed arrow 76 in FIGS. 4 and 5 energizing the door vertical-movement drive-mechanism 72 retracts the vertical support bracket 74 together with the door-removal drive-mechanism 62 carrying the end-effector 42 together with the door 48 vertically downward within covers 78 included in the load port interface 20. As depicted in FIG. 6, retraction of the end-effector 42 carrying the door 48 completely within the covers 78 exposes semiconductor wafers 82 carried within the FOUP 22 thereby providing semiconductor processing equipment attached to the load port interface 20 with access to the wafers 82. By reversing the process described above for removing the door 48 from the FOUP 22 to expose the wafers 82, the load port interface 20 seals the wafers 82 within the FOUP 22 by relatching the door 48 back into the FOUP 22.

To permit readily adapting the load port interface 20 for opening and closing the various different sizes of FOUP 22, i.e the smaller-short FOUP 22, the larger-short FOUP 22, the smaller-tall FOUP 22 and the larger-tall FOUP 22, the load port interface 20 preferably includes a removable FOUP-mating plate 92. A window 94, that is shaped to mate with the corresponding size of FOUP 22, pierces the FOUP-mating plate 92. Thus, merely by changing the FOUP-mating plate 92 and the end-effector 42, the load port interface 20 may be readily adapted for use with a different size FOUP 22.

To facilitate alignment of the load port interface 20 with attached semiconductor processing equipment, the load port interface 20 provides manual adjustments in all possible directions, i.e. up and down, left and right, in and out, and roll, pitch and yaw, for locating the bulkhead 24 with respect to such equipment.

In the preferred embodiment of the load port interface 20, the end-effector 42 includes a wafer sensor 86, preferably an optical sensor, that is located near the top of the end-effector 42. As the end-effector 42 retracts downward within the covers 78 the wafer sensor 86 sequentially passes each of the wafers 82 carried within the FOUP 22. By sensing the position of the wafers 82 as the end-effector 42 passes each of the wafers 82, the load port interface 20 obtains data that records both the number of wafers 82 carried within the FOUP 22, and the location of the wafers 82 vertically within the FOUP 22. Thus, during removal of the door 48 from the FOUP 22, a digital computer program executed by a digital control computer included in the load port interface 20, not illustrated in any of the FIGS., collects data needed for effective utilization of semiconductor processing equipment attached to the load port interface 20 when such equipment removes the wafers 82 from the FOUP 22.

To facilitate an explanation of wafer-location data-collection during descent of the end-effector 42 as indicated by the double-headed arrow 76, FIG. 8 schematically depicts a vertical stack of wafers 82, as they would be carried within the FOUP 22 with planar surfaces 92 of the wafers 82 disposed substantially parallel to each other. FIG. 8 also schematically depicts the end-effector 42 and the door vertical-movement drive-mechanism 72 including a lead screw 102 together with a stepper motor 104.

As illustrated in FIG. 8, the wafer sensor 86 includes a left-hand and a right-hand optical detector 106 that are mounted on the end-effector 42. The pair of optical detectors 106 are disposed symmetrically on opposite sides of a vertically oriented plane 112 that includes radii 114 of all the wafers 82. As depicted in FIG. 8, each wafer 82 usually has a notch 116 formed into a circumferential edge 118. The notches 116 permit processing equipment, if necessary, to automatically position each wafer in a pre-established orientation during processing. The notch 116 in each wafer 82 occupies approximately 0.5% to 0.3% of the circumference of the edge 118 of each wafer 82. Since approximately parallel beams of light 122 emitted from the optical detectors 106 impinge upon edges 118 at two separated locations rather than at a single location, one of the optical detectors 106 produces a signal even if the wafer 82 has an orientation that causes the light from the other optical detector 106 to impinge upon the notch 116.

Each optical detector 106 is a commercially available item which includes a laser diode that emits the beam of light 122 and a diode light sensor. The beam of light 122 from the laser diode focuses at a distance of approximately 4.5 inches from the optical detector 106. Similarly, the diode light sensor receives light along a path 124 that is also focused approximately 4.5 inches from the optical detector 106. When mounted on the end-effector 42, the optical detector 106 is spaced approximately 2.6 inches from edges 118 of the wafers 82. Thus a defocused beam of light 122 strikes the edges 118 of the wafer 82 as the end-effector 42 descends or rises, and the diode sensor is also defocused. In this way the laser diode does not generate a signal responsive to light reflected from a single point, but rather generates a signal that is responsive to light reflected over an area on the edge 118 of each wafer 82. Use of a defocused beam of light 122 and sensor diode in this way reduces specular reflection from the edges 118 of the wafers 82.

The various items depicted in FIG. 8 concurrently provide the digital control computer with two different types of data. First, as indicated by an arrow 126 data specifying a Z-axis location for the FOUP 22 as it either descends downward or rises upward past the stack of wafers 82 can be obtained by counting pulses supplied to the stepper motor 104. Concurrently with receiving Z-axis position data from the stepper motor 104, the digital control computer also receives binary data independently from each of the left-hand and right-hand optical detectors 106, depicted in the illustration of FIG. 8 by an arrow 128. The binary data which the digital control computer receives independently from each optical detector 106 indicates either reflection of light, or an absence of reflected light.

FIG. 9 schematically illustrates a stack of wafers 82, analogous to the stack of wafers 82 illustrated in FIG. 8, each of which is carried in a horizontal slot 132 provided on an interior surface of the FOUP 22. In the FOUP 22 depicted in FIG. 9, as intended some of the slots 132 carry only a single wafer 82, or are empty and therefore lack any wafer 82. However, as can be reasonably anticipated, normal operation of automatic material handling equipment does not always produce the intended result. Thus, in addition to the properly positioned wafers 82 the illustration of FIG. 9 depicts one slot 132 as holding two wafers 82 and 82a stacked one upon another rather than a single wafer 82. Also, in the illustration of FIG. 9 another pair of immediately adjacent slots 132 hold a single crossed wafer 82b that has a segment of a right-hand edge 118 located in an upper slot 132 of the pair, and a segment of a left-hand edge 118 located in a lower slot 132. Processing the Z-axis position data and the binary reflection data as described below permits automatically detecting each of the conditions illustrated in FIG. 9.

As the end-effector 42 begins descending into the covers 78 the optical detectors 106 initially independently detect reflection of light from a fiducial reflector 134, depicted both in FIGS. 8 and 9. The fiducial reflector 134 is permanently attached at a fixed location on the load port interface 20. As indicated in the table set forth below, the first Z-axis coordinate data collected by the digital computer program occurs when the beams of light 122 no longer reflects from the fiducial reflector 134. After collecting the Z-axis coordinates for the bottom edge of the fiducial reflector 134, the digital computer program then stops collecting data until the wafer sensor 86 descends into the region of the stack of wafers 82. Upon entering the region of the stack of wafers 82, the digital computer program resumes collecting Z-axis data at locations where the reflection of the beams of light 122 changes. Consequently, the digital computer program collects Z-axis coordinate data from the optical detectors 106 first at a top surface 136 of the edge 118 of each of the wafers 82, and then again at a bottom surface 138 thereof. Thus during each descent of the end-effector 42 the digital control computer collects the Z-axis coordinate data set forth in the table below for locations at which reflection changes only while the optical detectors 106 are located:

1. near the fiducial reflector 134; and
2. somewhere within the stack of wafers 82 carried by the FOUP 22.

Data collection by the digital control computer is disabled elsewhere throughout vertical movement of the end-effector 42.

|  | Left-Hand Optical Detector 106 | | Right-Hand Optical Detector 106 | |
|---|---|---|---|---|
|  | Top | Bottom | Top | Bottom |
| Fid. Ref. 134 |  | $Z_{LFB}$ |  | $Z_{RFB}$ |
| Slot No. |  |  |  |  |
| 1 | $Z_{LT1}$ | $Z_{LB1}$ | $Z_{RT1}$ | $Z_{RB1}$ |
| 2 | $Z_{LT2}$ | $Z_{LB2}$ | $Z_{RT2}$ | $Z_{RB2}$ |
| . | . | . | . | . |
| . | . | . | . | . |
| . | . | . | . | . |
| n | $Z_{LTn}$ | $Z_{LBn}$ | $Z_{RTn}$ | $Z_{RBn}$ |

Suspending data collection while the beams of light 122 moves from the bottom of the fiducial reflector 134 into the region of the stack of wafers 82 avoids collecting spurious data in the preceding table that may be caused by reflections from parts of the load port interface 20 and/or the FOUP 22 other than the fiducial reflector 134 and the edges 118 of the wafers 82. In a similar way the digital computer program executed by the digital control computer reduces noise by discarding Z-axis data indicating a wafer 82 having a thickness less than approximately 0.006 inches.

Electronic circuits and computer programming techniques needed for collecting the data set forth in the preceding table are completely conventional, and are well known to those skilled in the art. However, determining the presence or absence of wafers 82 in the slots 132 of a FOUP 22, the presence of two wafers 82 in one slot 132, and one wafer 82 crossing between two immediately adjacent slots 132 requires that the digital computer program executed by the digital control computer processes the collected Z-axis coordinate data in various different and innovative ways.

However before the load port interface 20 can be used for wafer-location data-collection with randomly chosen FOUPs 22 carrying a configuration of wafers 82 such as that illustrated in FIG. 9, the digital control computer must be calibrated for a particular type of FOUP 22. That is, FOUPs 22 made by different manufacturers usually support wafers 82 at different distances from the fixed fiducial reflector 134. Fortunately, a semiconductor wafer processing facility usually uses only one manufacturer's FOUPs 22, and distance variations between the fiducial reflector 134 and wafers 82 among one manufacturer's FOUPs 22 is sufficiently controlled that after a proper calibration of the load port interface 20 randomly chosen FOUPs 22 from a single manufacturer may be loaded onto the load port interface 20.

Calibration

As described in greater detail below, using the Z-axis coordinate data of the type set forth in the preceding table collected for a FOUP 22 loaded perfectly with wafers 82 so the optical detectors 106 will not encounter any of the notches 116, the calibration process preserves various data items for subsequent use during wafer-location data-collection for randomly chosen and configured FOUPs 22.

During calibration the Z-axis coordinate data in the preceding table for the left-hand and right-hand optical detectors 106 are used to compute a Distance between the bottom of the fiducial reflector 134 to the bottom of the wafer 82 in the top slot 132 of the FOUP 22 as expressed in the following equation.

$$\text{Distance} = \frac{1}{2}\{(Z_{LB1} - Z_{LBF}) + (Z_{RB1} - Z_{RBF})\}$$

Similarly, the calibration process determines an average Spacing between the slots 132 of the FOUP 22 using the following equation.

$$\text{Spacing} = 1/4\left\{ \frac{1}{n-1}\sum_{i=1}^{n-1}\left(Z_{LT_{(i+1)}} - Z_{LTi}\right) + \frac{1}{n-1}\sum_{i=1}^{n-1}\left(Z_{LB_{(i+1)}} - Z_{LBi}\right) + \frac{1}{n-1}\sum_{i=1}^{n-1}\left(Z_{RT_{(i+1)}} - Z_{RTi}\right) + \frac{1}{n-1}\sum_{i=1}^{n-1}\left(Z_{RB_{(i+1)}} - Z_{RBi}\right) \right\}$$

where n=the number of slots 132 and wafers 82 in the perfectly loaded FOUP 22.

The calibration process also computes an Offset between Z-axis coordinates measured by the left-hand and right-hand optical detectors 106. This Offset value is used to effectively co-planarize the Z-axis coordinate data during subsequent computation of Z-axis data, and during wafer-location data-collection for randomly chosen FOUPs 22. The Offset between the left-hand and right-hand optical detectors 106 is computed by averaging differences between top Z-axis coordinates and bottom Z-axis coordinates measured for each wafer respectively by the left-hand and right-hand optical detectors 106. The following equation expresses the computation of Offset.

$$\text{Offset} = 1/2 \left\{ \frac{1}{n}\sum_{i=1}^{n}(Z_{LTi} - Z_{RTi}) + \frac{1}{n}\sum_{i=1}^{n}(Z_{LBi} - Z_{RBi}) \right\}$$

where n=the number of slots 132 and wafers 82 in the perfectly loaded FOUP 22.

The Offset value thus determined is used during subsequent data analysis to effectively co-planarize the Z-axis coordinate data for the left-hand and right-hand optical detectors 106 in the way illustrated in the table of Z-axis coordinates set forth below.

| | Left-Hand Optical Detector 106 | | Right-Hand Optical Detector 106 | |
|---|---|---|---|---|
| | Top | Bottom | Top | Bottom |
| Fid. Ref. 134 Z-Axis Data No. | | $Z_{LFB}$ | | $Z_{RFB}$ + Offset |
| 1 | $Z_{LT1}$ | $Z_{LB1}$ | $Z_{RT1}$ + Offset | $Z_{RB1}$ + Offset |
| 2 | $Z_{LT2}$ | $Z_{LB2}$ | $Z_{RT2}$ + Offset | $Z_{RB2}$ + Offset |
| . | . | . | . | . |
| . | . | . | . | . |
| . | . | . | . | . |
| n | $Z_{LTn}$ | $Z_{LBn}$ | $Z_{RTn}$ + Offset | $Z_{RBn}$ + Offset |

The effectively co-planarized Z-axis coordinate data in the preceding table for the left-hand and right-hand optical detectors 106 are then combined in accordance with the equations set forth below to augment data in the Z-axis coordinate table by adding columns of data representing maximum Z-axis thicknesses computed for each row of Z-axis data except that row containing data for the fiducial reflector 134.

$Zmax_{Ti} = \text{maximum}(Z_{LTi}, Z_{RTi})$ $Zmax_{Bi} = \text{maximum}(Z_{LBi}, Z_{RBi})$ The Z-axis coordinate data in the table for the left-hand and right-hand optical detectors 106 are combined in accordance with the equations set forth below to further augment data in the Z-axis coordinate table by adding columns of data representing minimum Z-axis thicknesses computed for each row of Z-axis data except that row containing data for the fiducial reflector 134.

$Zmin_{Ti} = \text{minimum}(Z_{LTi}, Z_{RTi})$ $Zmin_{Bi} = \text{maximum}(Z_{LBi}, Z_{RBi})$ The Z-axis coordinate data added to the table in this way is set forth below.

| | Maximum Thickness Data | | Minimum Thickness Data | |
|---|---|---|---|---|
| | Top | Bottom | Top | Bottom |
| Fid. Ref. 134 Z-Axis Data No. | | | | |
| 1 | $Zmax_{T1}$ | $Zmax_{B1}$ | $Zmin_{T1}$ | $Zmin_{B1}$ |
| 2 | $Zmax_{T2}$ | $Zmax_{B2}$ | $Zmin_{T2}$ | $Zmin_{B2}$ |
| . | . | . | . | . |
| . | . | . | . | . |
| . | . | . | . | . |
| n | $Zmax_{Tn}$ | $Zmax_{Bn}$ | $Zmin_{Tn}$ | $Zmin_{Bn}$ |

The four columns of computed Z-axis data values that augment the Z-axis coordinated data are then used as set forth in the following equations to determine a maximum nominal wafer thickness, and a minimum nominal wafer thickness.

$$\text{Maximum nominal wafer thickness} = \frac{1}{n}\sum_{i=1}^{n}(Zmax_{Bi} - Zmax_{Ti})$$

$$\text{Minimum nominal wafer thickness} = \frac{1}{n}\sum_{i=1}^{n}(Zmin_{Bi} - Zmin_{Ti})$$

where n=the number of slots 132 and wafers 82 in the perfectly loaded FOUP 22.

During the calibration process the Distance, the Spacing, the Offset, the maximum nominal wafer thickness, and a minimum nominal wafer thickness values are preserved in permanent storage within the digital control computer included in the load port interface 20 for subsequent use during normal processing of wafers 82.

Processing

Having thus calibrated the load port interface 20 for a particular type of FOUP 22 and preserved the calibration values, the load port interface 20 is now ready to process randomly chosen FOUPs 22 that carry various configurations of wafers, 82 such as that illustrated in FIG. 9. As occurred during calibration, wafer-location data-collection begins with descent of the end-effector 42 between the covers 78 and collection of a new table of Z-axis coordinates similar to that set forth above. Z-axis coordinates data collection for the new table also employs the enabled and disabled intervals in the Z-axis motion described above.

If the Z-axis coordinates for two immediately adjacent intervals of reflection are extremely close together, e.g. less than 0.030 inches; then it is likely that the particular slot 132 holds two (2) wafers 82. As set forth in the expression below, when such a pair of Z-axis coordinate data occurs the two (2) sets of coordinates are combined into one (1) by eliminating the intermediate coordinates.

If $|Z_{LB(i+1)} - Z_{LTi}| < 0.03$ in. or $|Z_{RB(i+1)} - Z_{RTi}| < 0.03$ in., then $Z_{LBi} = Z_{LB(i+1)}, Z_{RBi} = Z_{RB(i+1)},$ and $(i + 1)$st row of coordinates eliminated.

After having combined sets of Z-axis coordinates as described above, as indicated in the expression set forth below the digital computer program discards any remaining Z-axis data that indicates a maximum thickness for a wafer 82 that is less than approximately 0.006 inches.

If $\{|Z_{LTi} - Z_{LBi}| < 0.006,$ and $|Z_{RTi} - Z_{RBi}| < 0.006\}$, then $i$th row of coordinates eliminated.

After having eliminated short Z-axis regions of reflection that were not combined to form a larger Z-axis region, the preserved Offset value that is preserved within the digital control computer is used to effectively co-planarize the Z-axis coordinate data for the left-hand and right-hand optical detectors 106 as described above for the calibration procedure.

Having effectively co-planarized the Z-axis coordinate data, a weighted combination of the preserved Offset value plus an adjustment of the Offset computed using the effectively co-planarized data is computed in accordance with the equation set forth below, and preserved within the digital control computer for use in processing the next randomly chosen FOUP 22.

$$Offset_{j+1} = (0.99 \times Offset_j) +$$

$$0.01 \times 1/2 \left\{ \frac{1}{n}\sum_{i=1}^{n}(Z_{LTi} - Z_{RTi}) + \frac{1}{n}\sum_{i=1}^{n}(Z_{LBi} - Z_{RBi}) \right\}$$

where n=the number of rows of Z-axis data. In this way over time the value of Offset becomes an average of offset values in Z-axis data collected for a large number of FOUPs 22.

After preserving the value of Offset to be used in processing the next randomly chosen FOUP 22, the Z-axis coordinate data in the table of Z-axis coordinate data are augmented by adding columns of data representing maximum Z-axis thicknesses data for the left-hand and right-hand optical detectors 106 in each row in the remaining Z-axis data. The maximum Z-axis thickness data for the present, randomly chosen FOUP 22 are determined in accordance with the equations set forth above in the description of calibration.

Again, if the Zmax coordinate data for two immediately adjacent intervals of reflection are extremely close together, e.g. less than 0.030 inches; then it is likely that the particular slot 132 holds two (2) wafers 82. As set forth in the expression below, when such a pair of Z-axis coordinate data occurs the two (2) sets of coordinates are combined into one (1) by eliminating the intermediate coordinates.

If $|Zmax_{B(i+1)} - Zmax_{Ti}| > 0.03$ in., then $Zmax_{Bi} = Zmax_{B(i+1)}$, $Zmin_{Bi} = Zmin_{B(i+1)}$, and $(i + 1)$st row of coordinates eliminated.

Having again attempted to combine immediately adjacent intervals of reflection that are extremely close together, the Z-axis coordinate data in the table of Z-axis coordinate data are augmented by adding columns of data representing minimum Z-axis thicknesses data for the left-hand and right-hand optical detectors 106 in each row in the remaining Z-axis data. The minimum Z-axis thickness data for the present, randomly chosen FOUP 22 are determined in accordance with the equations set forth above in the description of calibration.

Having now augmented the table of Z-axis coordinates with computed values for maximum thickness and minimum thickness for each of the rows remaining in the Z-axis data, starting with the row of Z-axis data nearest to the slot 132 data for each row is successively processed to determine if that data indicates:

1. a wafer 82 occupies a particular slot 132;
2. the wafer 82 is crossed such as the crossed wafer 82b depicted in FIG. 9; or
3. the slot 132 contains two wafers 82.

To determine if a wafer 82 occupies a particular slot 132, beginning with the row nearest to the fiducial reflector 134 the row's $Zmax_{Bi}$ value is compared with Z-axis coordinates for slots 132 that are successively farther from the fiducial reflector 134. Upon satisfying the expression set forth below for the smallest value of j indicates that the ith wafer 82 is located in the jth slot 132.

If $\{Distance+((j-1)\times Spacing)-Zmax_{Bi}\}<0.045$ in., then row $i$ records a wafer 82 present in slot $j$.

Upon determining that row i records a wafer 82 present in slot j, the data for row i is then further tested to determine if the wafer 82 crosses into slot (j+1).

If $\{Distance+((j-1)\times Spacing)-Zmax_{Ti}\}>0.045$ in., then row i records a wafer 82 present in slot j that crosses into slot $(j-1)$.

If the row i data does not specify a wafer 82 that crosses from one slot 132 to another slot 132, the digital computer program then determines if the row i data specifies two wafers 82 occupying a particular slot 132 such as the double wafers 82 and 82a depicted in FIG. 9. If a row of Z-axis data for a wafer 82 assigned to a slot 132 satisfies any of the three relationships set forth below, then the slot 132 holds double wafers 82.

1. $Zmin_{Ti}-Zmin_{Bi}>1.7\times$minimum nominal wafer thickness
2. $Zmax_{Ti}-Zmax_{Bi}>1.85\times$maximum nominal wafer thickness
3. $Zmax_{Ti}-Zmax_{Bi}>1.5\times$maximum nominal wafer thickness, and $Zmin_{Ti}-Zmin_{Bi}>0.5\times\{Zmax_{Ti}-Zmax_{Bi}\}$)), and $Zmin_{Ti}-Zmin_{Bi}>0.2\times$minimum nominal wafer thickness In addition to updating the value of offset to be used in subsequent processing of randomly chosen FOUPs 22, during normal processing the digital computer program also uses the thickness data for slots 132 occupied by a single wafer 82 to update the minimum nominal wafer thickness and a maximum nominal wafer thickness in accordance with the formula set forth below.

Maximum nomiminal wafer thickness$_{j+1}$=(0.99×Maximum nomiminal wafer thickness$_j$)+

Maximum nomiminal wafer thickness$_{j+1}$ =

(0.99 × Maximum nomiminal wafer thickness$_j$) +

$$\left( 0.01 \times \left\{ \frac{1}{n}\sum_{i=1}^{n}(Zmax_{Ti} - Zmax_{Bi}) \right\} \right)$$

Minimum nomiminal wafer thickness$_{j+1}$=(0.99×Minimum nomiminal wafer thickness$_j$)+

Minimum nomiminal wafer thickness$_{j+1}$ =

$$(0.99 \times \text{Minimum nomiminal wafer thickness}_j) + \left(0.01 \times \left\{\frac{1}{n}\sum_{i=1}^{n}(Zmin_{Ti} - Zmin_{Bi})\right\}\right)$$

where i=only those rows of data that specify a single wafer 82 occupying the slots 132, and
n=the number of slots 132 that are occupied by a single wafer 82.
In the same way the computer program also updates the value of spacing using a similarly weighted average of Z-axis coordinate data for only those pairs of immediately adjacent slots 132 that are respectively occupied by only a single wafer 82. The value of Distance is also updated in accordance with the equation set forth below for use in processing the subsequent randomly chosen FOUP 22.

Distance$_{j+1}$=0.999×Distance$_j$+0.001×[½{($Z_{LB1}$-$Z_{LBF}$)+($Z_{RB1}$-$Z_{RBF}$)}]

In the preceding way the load port interface 20 determines the presence or absence of wafers 82 in the slots 132 of a FOUP 22, one wafer 82 crossing between two immediately adjacent slots 132, or the presence of two wafers 82 in one slot 132. Having thus ascertained the preceding conditions for all wafers 82 in the FOUP 22, the load port interface 20 may then supply such information to semiconductor processing equipment attached to the load port interface 20 for use when such equipment removes the wafers 82 from the FOUP 22.

INDUSTRIAL APPLICABILITY

In the embodiment of the present invention depicted in FIGS. 1–7, the FOUP 22 is oriented to support the wafers 82 in a horizontal position that is orthogonal to the direction in which the end-effector 42 carrying the door 48 descends. Alternatively, inclusion in the load port interface 20 of an L-shaped moveable table 32 for securing the FOUP 22 and moving it horizontally so the FOUP 22 abuts with and seals against the bulkhead 24 positions the wafers 82 vertically, i.e. parallel to the direction of travel for the end-effector 42. Under certain circumstances such a vertical orientation of the wafers 82 may be advantageous because that orientation permits attached semiconductor processing equipment to omit an apparatus for reorienting the wafer from a horizontal position to a vertical position required for a particular process, e.g. wet etching.

Adapting the remainder of the load port interface 20 for opening and closing such a vertically oriented FOUP 22 requires only:

1. installing an appropriately adapted FOUP-mating plate 92 in the bulkhead 24; and
2. securing the end-effector 42 to the pedestal 64 in an orientation that is rotated 90° from that depicted in FIGS. 1–7.

Because the door 48 for the larger-tall FOUP 22 is essentially square, rotating the FOUP 22 so it supports the wafers 82 vertically does not significantly increase in the amount of vertical travel that the door vertical-movement drive-mechanism 72 must provide regardless of which of the four different types of FOUP 22 may be secured to the L-shaped moveable table 32.

For such an alternative embodiment load port interface 20 which supports the wafers 82 vertically, the wafer sensor 86 mounted rigidly to the end-effector 42 moves parallel to the wafers 82 during descent of the end-effector 42 rather than orthogonal to them. Therefore, descent of the end-effector 42 down between the covers 78 does not inherently permit a fixed wafer sensor 86 to gather data both for the number of wafers 82 carried within the FOUP 22, and their location. However, equipping the end-effector 42 with a wafer sensor 86 that scans horizontally during the descent of the end-effector 42 down between the covers 78 permits collecting wafer position data identical to that described above.

While wafer position analysis has been described above in the context of the load port interface 20, it is readily adaptable for use with load port interfaces adapted for opening and closing other types of semiconductor wafer pods such as the SMIF pod. In the instance of a load port interface for the SMIF wafer pod, the portion of the pod load interface whose motion separates the one-piece removable cover from the base carries the wafer sensor 86.

While the present invention envisions collecting Z-axis data from the stepper motor 104 by counting pulses supplied thereto as the wafer sensor 86 moves down and up past the wafers 82, any other rotary or linear electronic position encoder, such as a shaft-angle encoder, a magnetic ruler or even an optical interferometer, could also be used in implementing this particular aspect of the invention.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A wafer-handling interface adapted for mating with and engaging a pod, the pod providing a plurality of slots within the pod which adapt the pod to receive and carry a plurality of disk-shaped objects arranged as a stack with planar surfaces of the disk-shaped objects disposed substantially parallel; the wafer-handling interface comprising:

a table adapted for receiving the pod;

an effector adapted for movement along an axis past edges of the stacked disk-shaped objects disposed within the pod when the pod is received upon the table;

a drive-mechanism that upon activation moves said effector along the axis past edges of the stacked disk-shaped objects;

position-sensing means that provides coordinate data indicating locations of the effector as said drive-mechanism moves the effector along the axis past edges of the stacked disk-shaped objects;

a sensor secured to said effector that detects edges of the disk-shaped objects as said effector moves along the stack, and in response to the sensing thereof transmits an edge-detection signal; and wafer-locating means that receives the coordinate data from said position-sensing means and the edge-detection signal from said sensor, said wafer-locating means using the received coordinate data and edge-detection signal to determine when:

a) a single disk-shaped object occupies a particular slot in the pod;

b) a disk-shaped object crosses a slot within the pod thereby the disk-shaped object has a segment of the edge thereof disposed in a first slot and a diametrically opposite segment of the edge thereof disposed in a second slot that is immediately adjacent to the first slot; and c) a single slot holds two disk-shaped objects.

2. The wafer-handling interface of claim 1 wherein:

said drive-mechanism includes a lead screw which rotates to move said effector along the axis past edges of the stacked disk-shaped objects; and said position-sensing means includes a stepper motor coupled to said lead screw, operation of the stepper motor providing the coordinate data which indicates locations of the effector as said drive-mechanism moves the effector along the axis past edges of the stacked disk-shaped objects.

3. The wafer-handling interface of claim 1 wherein said sensor includes an optical sensor that emits at least two beams of light which are respectively disposed on opposite sides of a plane that includes radii of disk-shaped objects, the sensor producing the edge-detection signal in response to reflection of the beams of light from edges of the disk-shaped objects.

4. The wafer-handling interface of claim 3 wherein the beams of light emitted by the optical sensor that impinge upon the disk-shaped objects are defocused at edges of the disk-shaped objects from which the beams of light reflect.

5. The wafer-handling interface of claim 1 wherein said wafer-locating means stores and processes coordinate data for tops and bottoms of edges.

6. The wafer-handling interface of claim 5 wherein said wafer-locating means in processing the coordinate data combines coordinate data to determine a thickness for disk-shaped objects.

7. The wafer-handling interface of claim 6 wherein said wafer-locating means stores and processes coordinate data for two separated locations on edges of disk-shaped objects.

8. The wafer-handling interface of claim 6 wherein said wafer-locating means in processing the coordinate data determines a maximum thickness for disk-shaped objects.

9. The wafer-handling interface of claim 6 wherein said wafer-locating means in processing the coordinate data determines a minimum thickness for disk-shaped objects.

* * * * *